United States Patent [19]
Foulger et al.

[11] Patent Number: 5,630,995
[45] Date of Patent: May 20, 1997

[54] PREPARATION OF ANATASE TITANIUM DIOXIDE

[75] Inventors: David L. Foulger, Fairfield, England; Piergiorgio Nencini; Sergio Pieri, both of Follonica, Italy

[73] Assignee: Tioxide Group Services Limited, United Kingdom

[21] Appl. No.: 587,614

[22] Filed: Jan. 17, 1996

[30] Foreign Application Priority Data

Jan. 20, 1995 [GB] United Kingdom ............ 9501086

[51] Int. Cl.⁶ .................................. C01G 23/047
[52] U.S. Cl. .................. 423/616; 423/615; 423/610
[58] Field of Search ........................ 423/616, 615, 423/610

[56] References Cited

U.S. PATENT DOCUMENTS

| | | | |
|---|---|---|---|
| 1,795,467 | 3/1931 | Blumenfeld | 423/616 |
| 1,851,487 | 3/1932 | Blumenfeld | 423/616 |
| 2,516,548 | 7/1950 | Cauwenberg et al. | 423/615 |
| 2,721,787 | 10/1955 | Hettrick | 423/610 |
| 3,359,070 | 12/1967 | Roberts et al. | |
| 3,615,204 | 10/1971 | Libera et al. | 423/615 |
| 3,625,650 | 12/1971 | Libera et al. | |
| 3,632,527 | 1/1972 | Alpert et al. | 423/610 |
| 4,183,768 | 1/1980 | Knapp et al. | |

FOREIGN PATENT DOCUMENTS

| | | | |
|---|---|---|---|
| 02239119 | 9/1990 | Japan . | |
| 5-163022 | 6/1993 | Japan | 423/615 |
| 0831736 | 5/1981 | U.S.S.R. . | |
| 0916521 | 3/1982 | U.S.S.R. . | |
| 0975577 | 11/1982 | U.S.S.R. . | |
| 1085935 | 4/1984 | U.S.S.R. . | |
| 1323535 | 7/1987 | U.S.S.R. . | |
| 1560476 | 4/1990 | U.S.S.R. . | |
| 1604820 | 11/1990 | U.S.S.R. . | |
| 0 934 626 | 8/1963 | United Kingdom . | |
| 1 016 777 | 1/1966 | United Kingdom . | |
| 1 223 639 | 3/1971 | United Kingdom . | |
| 2247009 | 2/1992 | United Kingdom . | |
| 2 247 009 | 2/1992 | United Kingdom . | |

OTHER PUBLICATIONS

Chem. Abstracts vol. 118, No. 264110, 1993, no month.

*Primary Examiner*—Steven Bos

[57] ABSTRACT

A process for preparing anatase titanium dioxide by precipitating hydrous titanium oxide in the absence of added nuclei from a solution of titanium sulphate containing the equivalent of 200 to 300 grams $TiO_2$ per liter and having an acid to titanium ratio in the range 1.6:1 to 2.2:1, the precipitation being induced by the addition of 5 to 35 parts water per 100 parts titanium sulphate solution. The hydrous titanium oxide is calcined in the presence of an amount of potassium compound equivalent to between 0.20 and 0.60 weight percent calculated as $K_2O$ based on $TiO_2$ and between 0.15 and 0.55 weight percent phosphorus calculated as $P_2O_5$ based on $TiO_2$. The hydrous titanium oxide is subjected to calcination in a process having a specified thermal profile. The product of the process is anatase titanium dioxide having an average crystal size larger than conventionally prepared anatase. Said product is easily milled to form a product with a high single crystal fraction.

26 Claims, No Drawings

PREPARATION OF ANATASE TITANIUM DIOXIDE

This invention relates to the preparation of titanium dioxide and in particular to anatase titanium dioxide having a large crystal size.

The manufacture of titanium dioxide pigment by the so-called "sulphate process" has become well established producing two types of pigment, anatase titanium dioxide and the more valuable and technically important rutile titanium dioxide.

The pigmentary properties of rutile titanium dioxide make the pigment the preferred one but anatase does possess a higher degree of whiteness and brightness which are important in certain uses.

Consequently it would be advantageous if anatase titanium dioxide could be made with at least some improved pigmentary properties. In particular anatase titanium dioxide having a larger crystal size than is conventionally available is now recognised as desirable.

In the sulphate process a titaniferous ore is digested with concentrated sulphuric acid and the cake obtained is dissolved in weak acid or water to produce a solution of a titanium sulphate. This titanium sulphate is subsequently hydrolysed to precipitate hydrous titanium oxide either by the deliberate addition of nuclei ('Mecklenburg' process) or by inducing nuclei within the solution by the addition of water ('Blumenfeld') process. A process for making large crystal anatase using added nuclei has recently been described in GB 2 247 009. The current invention provides an alternative method to produce a similar product but employing the 'Blumenfeld' process.

According to the invention, a process for the preparation of anatase titanium dioxide comprises precipitating hydrous titanium oxide from an aqueous solution of a titanium sulphate in the absence of added nuclei and subjecting the hydrous titanium oxide to calcination wherein the titanium sulphate solution has a concentration equivalent to from 200 to 300 grams $TiO_2$ per liter and a ratio by weight of sulphate to titanium between 1.6:1 and 2.2:1 expressed as $H_2SO_4:TiO_2$, the precipitation of hydrous titanium oxide is induced by the addition of water to the titanium sulphate solution in an amount between 5 and 35 parts of water per 100 parts of titanium sulphate solution by weight, the precipitated hydrous titanium oxide is separated from the aqueous solution and subjected to calcination in the presence of a potassium compound and a phosphorus compound, the potassium compound being present in an amount equivalent to between 0.20 and 0.60 percent by weight potassium oxide calculated as $K_2O$ with respect to $TiO_2$ and the phosphorus compound being present in an amount equivalent to between 0.15 and 0.55 percent by weight phosphorus oxide calculated as $P_2O_5$ with respect to $TiO_2$, the thermal profile of the calcination being such that the titanium oxide is introduced initially into a first calcination zone having a gas temperature in the range 460° C. to 600° C. and subsequently passed to a second calcination zone having a gas temperature in the range 650° C. to 700° C., is heated by passing through the first zone and the second zone to a temperature in the range 650° C. to 700° C. over a period between 220 and 260 minutes, is further heated in a third zone to a temperature in the range 740° C. to 800° C. over a period between 20 and 60 minutes, is further heated in a fourth zone to a temperature in the range 845° C. to 900° C. over a period between 50 and 90 minutes, is further heated in a fifth zone to a temperature in the range 900° C. to 950° C. over a period between 30 and 70 minutes and is finally heated in a sixth zone to a temperature in the range 930° C. to 1020° C. over a period between 70 and 130 minutes.

This process has been found to produce anatase titanium dioxide with a larger average crystal size than anatase produced by conventional 'sulphate' processes.

Any appropriate titaniferous ore can be used to form the solution of titanium sulphate, typical ores being ilmenite or slag. These ores are digested in concentrated sulphuric acid to produce a digestion cake which is then dissolved in water or dilute acid to produce a solution of titanium sulphate.

This solution containing iron sulphate, titanium sulphate and sulphuric acid together with other impurities is usually treated with a reducing agent and filtered prior to hydrolysis in accordance with this invention.

According to the invention, prior to hydrolysis, the titanium sulphate has a concentration equivalent to between 200 and 300 grams per liter $TiO_2$ and the initially prepared solution is adjusted to this concentration, if necessary. Preferably, the concentration is in the range 230 to 270 grams per liter $TiO_2$.

The titanium sulphate used has a composition such that the ratio of sulphate to titanium by weight is in the range 1.60:1 to 2.20:1. As is conventional in the titanium dioxide industry this ratio is expressed as a ratio of weight of $H_2SO_4$ to weight of $TiO_2$. Preferably, this ratio is in the range 1.70:1 to 1.95:1 and, most preferably, in the range 1.80:1 to 1.85:1.

Hydrolysis of the titanium sulphate solution to produce hydrous titanium oxide is induced by the addition of water. Usually, the titanium sulphate is held at an elevated temperature during the addition. Preferably, the temperature of the titanium sulphate solution is between 80° C. and 100° C. and more preferably is between 90° C. and 100° C.

The water is added in an amount between 5 parts and 35 parts water by weight per 100 parts titanium sulphate solution. Preferably, the amount of water is from 18 to 25 parts by weight per 100 parts by weight titanium sulphate solution. Usually, the water is added to the titanium sulphate solution over a few minutes. A period of 10 to 20 minutes for a typical plant scale batch is normal.

After the addition of water the titanium sulphate solution is generally maintained at the temperature chosen for precipitation for a period to allow hydrolysis to proceed to completion. Usually, the solution is held at a temperature between 90° C. and 110° C. for a period between 200 and 400 minutes, typically for between 200 and 250 minutes.

The precipitated hydrous titanium dioxide is then separated from the residue of the titanium sulphate solution by any suitable means such as vacuum or pressure filtration. After filtration, the filter cake is normally washed with water and leached with small amounts of dilute sulphuric acid or other suitable reagents. After separation and washing, the damp filter cake typically contains between 40 and 55 percent $TiO_2$ by weight.

This filter cake is then dried during the subsequent calcination process.

The calcination takes place in the presence of at least one potassium compound and at least one phosphorus compound. These compounds are added in any convenient form but are typically added as a concentrated solution to the damp filter cake or as a feed to the calciner.

The amount of potassium compound used is between 0.20 and 0.60 per cent by weight calculated as $K_2O$ with respect to $TiO_2$. Preferably, the amount is from 0.30 to 0.50 percent $K_2O$ by weight with respect to $TiO_2$. Potassium compounds which are suitable include potassium sulphate and potassium chloride but potassium hydroxide is a convenient and preferred compound.

The amount of phosphorus compound used is between 0.15 and 0.55 percent by weight calculated as $P_2O_5$ with respect to $TiO_2$. Preferably, the amount is from 0.20 to 0.50 percent $P_2O_5$ by weight with respect to $TiO_2$. Phosphates of alkali metals or ammonium phosphates are suitable phosphorus compounds but the preferred compound is phosphoric acid.

Other compounds may be present during calcination, if desired. For example small amounts of aluminium compounds, equivalent to, for example up to 0.2 percent $Al_2O_3$ by weight with respect to $TiO_2$ may be added to correct any colour produced in the final anatase by trace impurities such as niobium compounds. However, the addition of any compounds which promote conversion of anatase to rutile should be avoided.

Control of the calcination profile is an important feature of this invention. The titanium oxide is introduced as a damp powder preferably at normal ambient temperature into the first calcination zone which has a gas temperature between 460° C. and 600° C. Preferably, the temperature is between 460° C. and 550° C. In the first zone the titanium oxide is heated and dried. It subsequently passes to a second calcination zone in which the gas temperature is in the range 650° C. to 700° C. As the titanium oxide passes through these two zones it is heated to a temperature in the range 650° C. to 700° C. over a period between 220 and 260 minutes. Preferably, the titanium oxide is heated to a temperature in the range 670° C. to 690° C. and the preferred heating period is 230 to 250 minutes. The titanium oxide then passes to a third zone where it is heated to a temperature in the range 740° C. to 800° C. over a period between 20 and 60 minutes. Preferably, in the third zone, the titanium oxide is heated to a temperature in the range 750° C. to 770° C. and the preferred heating period is between 20 and 40 minutes. Subsequently, in a fourth zone, the titanium oxide is heated to a temperature in the range 845° C. to 900° C. over a period between 50 and 90 minutes. Preferably, the titanium oxide is heated to a temperature in the range 860° C. to 890° C. and the preferred heating period is 50 to 70 minutes. In a fifth zone, the titanium oxide is further heated to a temperature in the range 900° C. to 950° C. over a period between 30 and 70 minutes. Preferably, the titanium oxide is heated to a temperature in the range 920° C. to 940° C. and the preferred heating period is 30 to 50 minutes. Finally, in a sixth zone, the titanium oxide is brought to a temperature in the range 930° C. to 1020° C. over a period between 70 and 130 minutes. Preferably the temperature of the titanium oxide at the end of the sixth zone is between 970° C. and 1010° C. and the preferred period in the sixth zone is 70 to 90 minutes.

The product from the calcination is cooled and normally subjected to treatment conventionally used in the titanium dioxide pigment industry. For example, it can be coated with hydrous oxides of elements such as aluminium, silicon, titanium and zirconium. It may also be treated with organic compounds such as polyols, alkanolamines and siloxanes. For example, treatment with trimethylolpropane, pentaerythritol, triethanolamine or dimethylsiloxane may be carried out.

Generally, the products have an average crystal size in the range 0.20 to 0.30 micrometer. The preferred products have an average crystal size in the range 0.25 to 0.30 micrometer and the most preferred products have an average crystal size in the range 0.25 to 0.27 micrometer. The geometric weight standard deviation of the crystal size is generally in the range 1.30 to 1.50 and frequently in the range 1.35 to 1.40.

In comparison with the products of GB2 247 009, it has been found that the products of this invention can be milled relatively easily. It is therefore possible to produce by milling, a product having a high single crystal fraction (i.e. the average particle size is only slightly higher than the average crystal size). In particular, the process of the invention provides a method for producing anatase titanium dioxide having an average crystal size greater than 0.20 micrometer and an average particle size less than 0.29 micrometer and preferably less than 0.28 micrometer. In a preferred product formed by milling the average crystal size is in the range 0.25 to 0.27 micrometer and the average particle size is in the range 0.27 to 0.29 micrometer.

Generally, at least 90% by weight of the product is in the anatase crystal form and preferably at least 95% is in the anatase form.

Uncoated products of this invention are useful in producing paper, paper coatings and cosmetics and as food additives. The coated products are useful for paints, especially emulsion paints and for inks, radiation-cured coatings, rubber and plastics. Generally the opacity of the products of this invention is improved compared to conventional anatase products that have a smaller average crystal size and the whiteness and brightness of the products is improved over rutile. The products are especially useful when used in conjunction with optical brighteners.

The invention is illustrated by the following example.

EXAMPLE

An aqueous solution of titanium sulphate containing the equivalent of 250 grams $TiO_2$ per liter and an acid to titanium ratio by weight, of 1.82 was hydrolysed by the addition of water in a proportion of 20.5 parts water per 100 parts titanium sulphate by weight. The water was added to the titanium sulphate solution at a temperature of 90° C. over a period of 15 minutes. The mixture was maintained at a temperature of 90° C. for 220 minutes when hydrolysis was complete. The precipitated titanium oxide was separated by filtration using a Moore filter and further dewatered on a pressure filter The filter cake was fed to a calciner at a feed rate of 2.9 te filter cake per hour. A concentrated solution of potassium hydroxide and phosphoric acid was added to the calciner feed at a rate sufficient to introduce 0.30% $K_2O$ and 0.39% $P_2O_5$ by weight with respect to $TiO_2$. The average gas temperature of the zone into which the filter cake was introduced was 524° C. and the titanium oxide was heated in this zone and a second zone to 680° C. with an average residence time in the two zones combined of 240 minutes. The titanium oxide was subsequently heated to 750° C. over a period of 30 minutes in a third zone, to 880° C. over a period of 60 minutes in a fourth zone, to 925° C. over a period of 40 minutes in a fifth zone and was finally discharged from the calciner at a temperature of 985° C. after a further 80 minutes residence in a sixth zone.

The final product was found to have an average crystal size of 0.25 micrometer and 99% was in the anatase crystal form.

After coating with alumina and silica using a standard recipe it was used to prepare an emulsion paint which had a higher opacity than a paint made from a conventional anatase pigment with a similar inorganic coating.

We claim:

1. A process for the preparation of anatase titanium dioxide comprising precipitating hydrous titanium oxide from an aqueous solution of a titanium sulphate in the absence of added nuclei and subjecting the hydrous titanium oxide to calcination wherein the titanium sulphate solution has a concentration equivalent to from 200 to 300 grams $TiO_2$ per liter and a ratio by weight of sulphate to titanium between 1.6:1 and 2.2:1 expressed as $H_2SO_4:TiO_2$, the precipitation of hydrous titanium oxide is induced by the addition of water to the titanium sulphate solution in an amount between 5 and 35 parts of water per 100 parts of titanium sulphate solution by weight, the precipitated hydrous titanium oxide is separated from the aqueous solution and subjected to calcination in the presence of a potassium compound and a phosphorus compound, the potassium compound being present in an amount equivalent to between 0.20 and 0.60 percent by weight potassium oxide calculated as $K_2O$ with respect to $TiO_2$ and the phosphorus compound being present in an amount equivalent to between 0.15 and 0.55 percent by weight phosphorus oxide calculated as $P_2O_5$ with respect to $TiO_2$, the thermal profile of the calcination being such that the titanium oxide is introduced initially into a first calcination zone having a gas temperature in the range 460° C. to 600° C. and subsequently passed to a second calcination zone having a gas temperature in the range 650° C. to 700° C., is heated by passing through the first zone and the second zone to a temperature in the range 650° C. to 700° C. over a period between 220 and 260 minutes, is further heated in a third zone to a temperature in the range 740° C. to 800° C. over a period between 20 and 60 minutes, is further heated in a fourth zone to a temperature in the range 845° C. to 900° C. over a period between 50 and 90 minutes, is further heated in a fifth zone to a temperature in the range 900° C. to 950° C. over a period between 30 and 70 minutes and is finally heated in a sixth zone to a temperature in the range 930° C. to 1020° C. over a period between 70 and 130 minutes.

2. A process according to claim 1 in which the concentration of the titanium sulphate is equivalent to from 230 to 270 grams $TiO_2$ per liter.

3. A process according to claim 1 in which the titanium sulphate solution has a ratio of sulphate to titanium by weight in the range 1.70:1 to 1.95:1 expressed as weight of $H_2SO_4$ to weight of $TiO_2$.

4. A process according to claim 1 in which water is added to the titanium sulphate solution in an amount between 18 and 25 parts by weight of water per 100 parts by weight of titanium sulphate solution.

5. A process according to claim 1 in which the water is added to the titanium sulphate solution whilst said titanium sulphate solution is held at a temperature between 80° C. and 100° C.

6. A process according to claim 1 in which the water is added to the titanium sulphate solution over a period of 10 to 20 minutes.

7. A process according to claim 1 in which the titanium sulphate solution is held at a temperature in the range 90° C. to 110° C. for a period between 200 and 400 minutes after addition of the water.

8. A process according to claim 1 in which the precipitated hydrous titanium oxide which is introduced into the first calcination zone contains between 40 and 55 percent $TiO_2$ by weight.

9. A process according to claim 1 in which the potassium compound is selected from the group consisting of potassium sulphate, potassium chloride and potassium hydroxide.

10. A process according to claim 1 in which the potassium compound is present during calcination in an amount in the range 0.30 to 0.50 percent by weight calculated as $K_2O$ with respect to weight of $TiO_2$.

11. A process according to claim 1 in which the phosphorus compound is selected from the group consisting of alkali metal phosphates, ammonium phosphates and phosphoric acid.

12. A process according to claim 1 in which the phosphorus compound is present during calcination in an amount in the range 0.20 to 0.50 percent by weight expressed as $P_2O_5$ with respect to weight of $TiO_2$.

13. A process according to claim 1 in which an aluminium compound is present during calcination in an amount up to 0.2 percent by weight calculated as $Al_2O_3$ based on weight of $TiO_2$.

14. A process according to claim 1 in which the gas temperature in the first calcination zone is in the range 460° C. to 550° C.

15. A process according to claim 1 in which the titanium oxide is heated to a temperature in the range 670° C. to 690° C. as it passes through the first and second calcination zones.

16. A process according to claim 1 in which the titanium oxide is heated to a temperature in the range 750° C. to 770° C. in the third calcination zone.

17. A process according to claim 1 in which the titanium oxide is heated to a temperature in the range 860° C. to 890° C. in the fourth calcination zone.

18. A process according to claim 1 in which the titanium oxide is heated to a temperature in the range 920° C. to 940° C. in the fifth calcination zone.

19. A process according to claim 1 in which the titanium oxide is heated to a temperature in the range 970° C. to 1010° C. in the sixth calcination zone.

20. A process according to claim 1 in which the titanium oxide is heated in the first and second calcination zones over a period of 230 to 250 minutes.

21. A process according to claim 1 in which the titanium oxide is heated in the third calcination zone for a period between 20 and 40 minutes.

22. A process according to claim 1 in which the titanium oxide is heated in the fourth calcination zone for a period between 50 and 70 minutes.

23. A process according to claim 1 in which the titanium oxide is heated in the fifth calcination zone for a period between 30 and 50 minutes.

24. A process according to claim 1 in which the titanium oxide is heated in the sixth zone for a period between 70 and 90 minutes.

25. A process according to claim 1 in which the anatase titanium dioxide prepared has an average crystal size in the range 0.20 to 0.30 micrometer.

26. A process according to claim 25 in which the geometric weight standard deviation of crystal size is in the range 1.30 to 1.50.

\* \* \* \* \*